United States Patent
Schiele et al.

(10) Patent No.: US 11,973,147 B2
(45) Date of Patent: Apr. 30, 2024

(54) POWER SEMICONDUCTOR COMPONENT FOR VOLTAGE LIMITING, ARRANGEMENT HAVING TWO POWER SEMICONDUCTOR COMPONENTS, AND A METHOD FOR VOLTAGE LIMITING

(71) Applicant: Infineon Technologies Bipolar GmbH & Co. KG, Warstein (DE)

(72) Inventors: Juergen Schiele, Baesweiler (DE); Reiner Barthelmess, Soest (DE); Uwe Kellner-Werdehausen, Leutenbach (DE); Sebastian Paul Sommer, Castrop-Rauxel (DE)

(73) Assignee: Infineon Technologies Bipolar GmbH & Co. KG, Warstein (DE)

( * ) Notice: Subject to any disclaimer, the term of this patent is extended or adjusted under 35 U.S.C. 154(b) by 256 days.

(21) Appl. No.: 17/666,942

(22) Filed: Feb. 8, 2022

(65) Prior Publication Data
US 2022/0262960 A1    Aug. 18, 2022

(30) Foreign Application Priority Data

Feb. 12, 2021   (DE) .......................... 102021103355.1
Mar. 17, 2021  (DE) .......................... 102021106536.4

(51) Int. Cl.
*H01L 29/87*   (2006.01)
*H01L 31/102*  (2006.01)

(52) U.S. Cl.
CPC ............ *H01L 29/87* (2013.01); *H01L 31/102* (2013.01)

(58) Field of Classification Search
CPC . H01L 29/87; H01L 29/7424; H01L 27/0255; H01L 31/102; H01L 29/0661; H01L 27/0296; H01L 27/0817; H01L 29/0626; H01L 29/74
See application file for complete search history.

(56) References Cited

U.S. PATENT DOCUMENTS

| | | | |
|---|---|---|---|
| 6,373,079 B1* | 4/2002 | Ruff | H01L 29/1016 257/E29.107 |
| 2007/0051972 A1* | 3/2007 | Schulze | H01L 31/1113 257/E29.026 |

FOREIGN PATENT DOCUMENTS

| | | |
|---|---|---|
| DE | 19650762 A1 | 7/1998 |
| DE | 102009051828 A1 | 5/2011 |
| DE | 102019124695 A1 | 2/2021 |

* cited by examiner

*Primary Examiner* — Wasiul Haider
(74) *Attorney, Agent, or Firm* — Murphy, Bilak & Homiller, PLLC (57) ABSTRACT

A power semiconductor component for voltage limiting includes a rear-side base zone electrically contacted with a rear-side electrode and a front-side base zone electrically contacted with a front-side electrode. At least one switch-on structure is embedded at least into one of the rear-side base zone and the front-side base zone and is electrically contacted by the electrode contacting the embedding base zone. At least one triggering structure is provided as a breakdown structure of a first type, present between the front-side and rear-side electrodes. At least one further triggering structure is provided as a breakdown structure of a second type, present between the front-side and rear-side electrodes. The front-side and rear-side electrodes are each electrically conductively pressure-contacted by an electrically conductive contact plate at least one of which functions as a heat sink for dissipating heat generated in the semiconductor body.

18 Claims, 4 Drawing Sheets

POWER SEMICONDUCTOR COMPONENT FOR VOLTAGE LIMITING, ARRANGEMENT HAVING TWO POWER SEMICONDUCTOR COMPONENTS, AND A METHOD FOR VOLTAGE LIMITING

TECHNICAL FIELD

The invention relates to a power semiconductor component for voltage limiting, an arrangement consisting of two power semiconductor components for voltage limiting, and an arrangement consisting of a power transformer and a power semiconductor component for voltage limiting. The invention also relates to a method for voltage limiting by means of a power semiconductor component.

BACKGROUND

Power semiconductors are increasingly used in medium/high-voltage networks or medium/high-voltage systems, i.e. in high-voltage networks/systems for electrical voltages greater than 1 kV, for example medium-voltage networks in the range from 1 kV to 50 kV or 1 kV to 60 kV or above. The requirements imposed by lightning strikes also lead to particular requirements on the overvoltage resistance. These are also tested in the context of type testing of medium-voltage systems. For example, in 33 kV systems, a pulsed voltage of up to 170 kV (1.2/50 µs) is applied to the system. The IEC 60076-11 standard is one example. The semiconductors or power semiconductors installed directly in the medium-voltage application must also pass this test.

In the event of an extremely rapid transient fault, i.e. voltage transients with extremely high dv/dt and overvoltage, there is no means of control or activation of the semiconductor which causes it to respond to the fault event in real time, depending on the operation. In addition, protective circuits require their own protection. In such a fault case, the semiconductor can no longer be switched on sufficiently quickly and safely without destroying itself and thus also its immediate application environment, even if it is triggered in the normal way, for example by a light pulse or an electrical trigger/activation signal in conjunction with an external fault protection circuit.

The publication DE 196 50 762 A1 discloses a thyristor consisting of a semiconductor body with an anode-side base zone of the first conductor type and at least one cathode-side base zone of the opposite, second conductor type, with anode-side and cathode-side emitter zones, and with at least one region in the cathode-side base zone which has a breakdown voltage reduced by its geometry compared to the remaining regions in the cathode-side base zone and the border of the semiconductor body.

The publication DE 10 2019 124 695 A1 discloses a short-circuit semiconductor component comprising a semiconductor body in which are arranged a base zone of a first conductor type on the rear side, an inner zone of a second conductor type complementary to the first conductor type, and a base zone of the first conductor type on the front side. The rear-side base zone is electrically conductively connected to a rear-side electrode and the front-side base zone is electrically conductively connected to a front-side electrode, wherein at least one front-side activation structure is embedded in the front-side base zone and at least partially covered by the front-side electrode and/or at least one rear-side activation structure is embedded in the rear-side base zone and at least partially covered by the rear-side electrode. The activation structure is an emitter structure of the second conductor type that is in electrically conductive contact with the electrode applied to this respective embedding base zone, and which can be switched on by means of at least one triggering structure electrically acting on it via the semiconductor body, wherein said triggering structure can in turn be activated by means of an electrical activation signal fed to it. When activated, the triggering structure injects an electrical current pulse into the semiconductor body, which irreversibly destroys a first semiconductor junction formed between the activation structure and this embedding base zone and/or a second semiconductor junction formed between this base zone and the inner zone.

The publication DE 10 2009 051 828 A1 discloses a semiconductor device comprising a first component, a second component, a substrate in which the first component and the second component are formed laterally next to each other, and a recombination zone. The recombination zone is formed in the substrate between the first component and the second component so that diffusing charge carriers recombine between the first component and the second component.

SUMMARY

Against this background, the object of the present invention is to provide a power semiconductor component having reliable voltage limitation in the case of fast, in particular highly transient, high-voltage/surge voltage events such as lightning strikes, in order to ensure safe operation of electrical plants and systems, in particular in medium- and high-voltage applications, even in the case of such fault events. In addition, this protective function should be able to be provided for the electrical plants or systems without great structural or design effort, including retrospectively for already existing electrical plants/systems, for example.

It should be noted that the features listed individually in the claims can be combined with each other in any technically appropriate way (including across category boundaries, for example between the device and method) and specify additional embodiments of the invention. The description additionally characterizes and specifies the invention, in particular in relation to the figures.

It should also be pointed out that a conjunction "and/or" as used in the following, placed between two features and linking them together, is always to be interpreted such that in a first form of the subject matter according to the invention only the first feature can be present, in a second form only the second feature can be present, and in a third form both the first and the second feature can be present.

In addition, the term "approximately" used herein is intended to indicate a tolerance range which the person skilled in the art working in the relevant field would consider to be customary. In particular, the term "approximately" refers to a tolerance range of the relevant variable of up to a maximum of +/−20%, preferably up to a maximum of +/−10%.

According to the invention, a power semiconductor component for voltage limiting comprises a semiconductor body in which, in a vertical direction from a rear side to a front side opposite the rear side, a rear-side base zone of a first conductor type (e.g. p-type), an inner zone of a second conductor type complementary to the first conductor type (e.g. n-type), and a front-side base zone of the first conductor type are arranged consecutively, wherein the rear-side base zone is electrically contacted by a rear-side electrode (herein also referred to as the anode) and the front-side base zone is electrically contacted by a front-side electrode (herein also referred to as the cathode), wherein in at least one of the two base zones at least one activation structure formed as an emitter structure of the second conductor type is embedded, which is electrically contacted by the electrode contacting the embedding base zone, wherein the activation structure can be switched on by means of at least one triggering structure which electrically acts on it via the semiconductor body and which can be activated by means of at least one electrical activation signal supplied to it, at least one triggering structure (13) being provided as a breakdown structure of a first type, which is designed to be activated when a high voltage above a predetermined voltage level (=breakdown voltage), forming its activation signal, is applied between the front-side electrode and the rear-side electrode, and at least one additional triggering structure is provided as a breakdown structure of a second type, which is designed to be activated when a high voltage above a predetermined voltage gradient, forming its activation signal, is applied between the front-side and the rear-side electrode.

A medium or generally a high voltage is to be understood to mean an electrical voltage greater than 1 kV, for example in the range of approximately 1 kV to approximately 60 kV, or approximately 1 kV to approximately 52 kV.

The two breakdown structures of the first and second type, as provided according to the invention, ensure reliable overvoltage protection by means of internal voltage limiting functions directly integrated and combined in the power semiconductor device according to the invention, in particular for the application described at the beginning (i.e. in the case of rapid, highly-transient high-voltage/surge-voltage events). On the one hand, the protective functions ensure a sufficiently fast activation and on the other hand they reliably prevent damage to the power semiconductor component itself, which would otherwise occur due to the high electrical starting loads (e.g. power density in the semiconductor body) in the aforementioned surge voltage cases.

Furthermore, the invention simplifies the construction of such a power semiconductor component and its application in medium- and high-voltage plants/systems by the fact that no external protective circuit needs to be provided in order to trigger/switch on the semiconductor when necessary, for example with an electrical or optical activation signal. The power semiconductor component according to the invention can be used, for example, directly on the high-voltage winding of a high-voltage power transformer, without necessarily being limited to this.

The combination of the two integrated breakdown structures of the first and second types provides a total of three sub-functions which ensure the protection of the power semiconductor component and its environment against overvoltages. The power semiconductor component is triggered internally when an overvoltage event occurs and is not damaged in the process if a predetermined voltage gradient dv/dt is exceeded (activation of the second type of breakdown structure) and/or a predetermined anode-cathode voltage is exceeded (activation of the first type of breakdown structure), wherein the power semiconductor component exhibits a predetermined avalanche behavior within an activation/turn-on delay time of the breakdown structure of the first and second types and optionally other triggering structures provided (e. g. AG structure), which can last for approximately 0.5 µs up to 5 µs, for example, until the entire power semiconductor component or the emitter structure acting as an activation structure turns on or conducts and limits or reduces the applied overvoltage, which ensures that the power semiconductor component withstands this time-limited state of very high power density undamaged, although the actual course of the voltage loading in an overvoltage/surge voltage event is not known in advance.

For example, in the event of a particularly steep rise in voltage at the anode-cathode terminals, the breakdown structure of the second type (dv/dt) already effectively provides its protective effect for triggering/switching on the semiconductor component (dv/dt protection function), wherein at this time the predetermined breakdown voltage level for the first-type breakdown structure has not yet been reached.

Since the power semiconductor component cannot switch on or into a conducting state arbitrarily quickly at exactly this time due to its structure and due to the extremely short rise time of the voltage and its triggering delay time, the anode-cathode voltage ultimately reaches the breakdown threshold of the breakdown structure of the first type, thereby (additionally) effectively activating its protective function to activate the semiconductor component.

If the power semiconductor component has not yet switched on or into a conducting state quickly enough and/or completely when the defined voltage threshold for the breakdown structure of the first type is reached, in order to limit the anode-cathode voltage to the permissible range or to reduce the applied voltage, in the end the semiconductor component itself must still withstand the overvoltage present during this delay/triggering delay phase. Due to the avalanche behavior of the semiconductor component, this voltage is reliably clamped (e.g. for the period of 0.5 µs to 5 µs) until the semiconductor component is sufficiently switched on or into the conducting state, as a result of which the voltage applied to the anode and cathode rapidly decays (<90% and below with respect to the level of the clamped overvoltage present), and thus protects the high-voltage system and itself from being destroyed by the overvoltage. During this short phase, the semiconductor component is exposed to an extremely high power density (high voltage near the avalanche breakdown of the component and very reverse current in the Ampere range).

This means that the transient overvoltage on the medium/high-voltage network (e.g. due to a lightning pulse) can no longer develop in the system. The system is protected.

It should be noted that the total activation time of the power semiconductor component, i.e. until the activation structure (emitter structure) is also completely switched on after the activation of the triggering structures, a certain additional time elapses which depends on the size (diameter) of the semiconductor component and can be, for example, up to several 100 µs to 1 ms or above, until the current plasma in the area of the main electrode (cathode) has propagated fully in a radial direction from inside to outside, wherein a typical propagation velocity can be approximately 0.1 mm/µs.

According to a preferred development of the invention, the level of the high voltage(=breakdown voltage) activating the triggering structure of the first type is in a range from 60% to 90%, preferably from 65% to 85%, more preferably from 70% to 80%, of a maximum breakdown voltage of the semiconductor body.

According to a preferred development of the invention, the triggering structure of the first type is designed as a break-over semiconductor structure (BOD).

Such a break-over semiconductor structure is characterized by the fact that the BOD tips over from a high-resistance initial state to a low-resistance, conductive state (breakover) when a specific voltage (breakdown voltage) of appropriate polarity is exceeded. This state exists until a specific holding current is undershot. The breakover semiconductor structure then returns to the high-resistance initial state.

According to a preferred development of the invention, the triggering structure of the first type is arranged in a central region of the semiconductor body and the triggering structure of the second type is arranged further outward in a radial direction of the semiconductor body with respect to the triggering structure of the first type.

According to a preferred development of the invention, a triggering stage structure (also referred to as an amplifying-gate structure or AG structure) with at least one triggering stage is provided and arranged in a radial direction of the semiconductor body between the at least one triggering structure and the activation structure in such a way that the at least one triggering structure, when activated, switches on the activation structure by triggering at least one triggering stage.

According to a preferred development of the invention, the triggering structure of the second type is arranged in the semiconductor body in such a way that, when activated, it triggers the at least one triggering stage of the triggering stage structure.

According to a preferred development of the invention, at least one triggering structure of the at least one triggering structure is formed as a light-sensitive semiconductor region to which an optical signal can be supplied as the activating signal, wherein one of the triggering stages can be the light-sensitive triggering structure.

According to a preferred development of the invention, at least two triggering stages are provided, with a lateral current limiting resistor being arranged between one triggering stage and the other.

According to a preferred development of the invention, at least one triggering structure of the at least one triggering structure is formed as an electrode to which an electrical signal can be supplied as the activating signal, wherein one triggering stage electrode of the at least one triggering stages forms the triggering structure implemented as an electrode.

According to a preferred development of the invention, the triggering structure formed as an electrode is the triggering stage electrode of the triggering stage of the at least one triggering stage, which is arranged in the radial direction of the semiconductor body according after the current limiting resistor and before the activation structure, i.e. between the current limiting resistor and the activation structure.

The invention provides that the front-side electrode and the rear-side electrode are each pressure-contacted in an electrically conductive manner by means of an electrically conductive, e.g. metallic, contact disc. In this case, the respective contact disc can preferably have the same lateral extension/width as the corresponding electrode, so that the contact disc completely covers the corresponding electrode. The contact discs are permanently connected, for example by means of an alloy, to the corresponding metal electrode of the semiconductor body. The contact discs may be formed as pure molybdenum discs or may consist of a combination of a molybdenum and copper disc, preferably with the molybdenum in direct contact with the metallization of the semiconductor body.

At least one of the electrically conductive contact discs is designed in such a way that it acts as a heat sink for dissipating heat generated in the semiconductor body out of the semiconductor body. The contact disc forming the heat sink can preferably be made entirely or to a large extent from molybdenum. The contact disc acting as a heat sink can have a corresponding thickness depending on the desired heat transfer/heat dissipation properties. If essentially only one of the two contact discs is provided as a heat sink, the contact disc forming the heat sink may have a much larger thickness than the other contact disc.

According to an even more preferred embodiment of the invention, between the contact disc acting as a heat sink and the respective electrode, a low-temperature connection layer (LTC) can be arranged which is formed, for example, as a sintered layer.

As has already been explained above, if the power semiconductor component reaches the "avalanche" state for a few microseconds, it may be exposed to a very high power density. At the same time, if a very high blocking voltage is applied and high blocking currents are present, which can lie in the Ampere range, the entire component is strongly heated for a short time, both in the active surface, which is directly contacted and pressed by the contact discs, and in the border region of the component. The border region is preferably protected by a passivation layer (silicone). A thick molybdenum contact disc can act as a heat sink and absorb a majority of this pulse-like transient heat generation. In this case, it is therefore essential that a coherent contact or a fixed connection (e.g. LTC) is established between the metallization (electrodes) of the semiconductor body and the heat-dissipating, thick Mo contact or carrier disk and that the border region of the semiconductor component covered by the passivation is also located in the area of this "coherent" connection with the Mo carrier disc and does not protrude beyond the Mo carrier disk (or has no permanent connection). A permanent connection guarantees a lower thermal transfer resistance compared to a "free-floating" structure. This structure supports the safe and reliable functioning of the power semiconductor component according to the invention.

According to a preferred development of the invention, a housing accommodating the semiconductor body is provided, which has a lead-through only for the high voltage applied to the front and the rear electrodes respectively. For example, the housing is a diode housing with two electrical terminals.

According to a further aspect of the invention, an arrangement is provided consisting of a first power semiconductor component for voltage limiting according to one of the embodiments disclosed herein and a second power semiconductor component for voltage limiting according to one of the embodiments disclosed herein, wherein the two power semiconductor components are electrically interconnected in antiparallel. In contrast to the unidirectional operating mode of the power semiconductor component described here, this interconnection of the two power semiconductor components provides a bi-directional operating mode that guarantees a protective effect when positive and negative medium-high voltage is applied to the two electrodes.

It should be noted that with regard to the definition of terms concerning the arrangement, as well as the effects and advantages of features concerning the arrangement, reference is made in full to the disclosures of equivalent definitions, effects and advantages of the power semiconductor component in accordance with the invention disclosed herein. Disclosures herein concerning the power semiconductor component according to the invention can also be applied mutatis mutandis to the definition of the arrangement according to the invention unless this is expressly excluded. Disclosures herein concerning the arrangement according to the invention can also apply mutatis mutandis to the definition of the power semiconductor component according to the invention unless this is expressly excluded.

Thus, a repetition of explanations of equivalent features, their effects and advantages are omitted in favor of a more compact description, without such omissions being interpreted as a restriction.

According to a preferred development of the invention, the two power semiconductor components are arranged diametrically to each other in a common semiconductor body and electrically isolated from each other by a separation trench.

According to a preferred development of the invention, the separation trench is formed as a galvanic isolation or resistance zone between the two power semiconductor components. A weakly doped semiconductor zone, for example a p-zone, can be provided as the resistance zone.

According to another aspect of the invention, an arrangement consisting of a power transformer and at least one power semiconductor component for voltage limiting according to one of the embodiments disclosed herein is provided, wherein the power semiconductor component is connected to a high-voltage winding of the power transformer.

For the purposes of the invention, a power transformer can be understood as an electrical transformer which is designed for power ratings in the range of, for example, approximately 1 MVA to approximately 100 MVA. This should include in particular devices in electrical energy networks, which can often be designed as three-phase AC transformers, but also as single-phase transformers for a traction power supply, for example.

With regard to the arrangement of the power semiconductor component according to the invention with the power transformer, it should be noted that with regard to the definition of terms concerning the arrangement, as well as the effects and advantages of features concerning the arrangement, reference is made in full to the disclosures of equivalent definitions, effects and advantages of the power semiconductor component in accordance with the invention disclosed herein. Thus, a repetition of explanations of equivalent features, their effects and advantages can also be omitted in favor of a more compact description, without such omissions being interpreted as a restriction.

According to a preferred development of the invention, the power transformer is a high-voltage transformer, i.e. a transformer that is configured to transform electrical voltages greater than 1 kV, e.g. medium-high voltages in the range of approximately 1 kV to 50 kV or approximately 1 kV to 60 kV, or also high voltages above 60 kV or greater.

The power semiconductor component according to the invention provides the desired overvoltage protection by means of the protective functions integrated in the semiconductor body. This means that it does not require any control information/control signals dependent on the operation of the electrical system/high-voltage system. The protective function ensures safe operation of the electrical system.

The triggering structure(s) providing the protective function, in particular the breakdown structures of the first and/or second type, are in principle preferably arranged in a central area of the semiconductor body, but without necessarily being limited to this.

In the case of a rapid high-voltage event, the power semiconductor component triggers itself without external intervention, that is, in the event of very fast, high-voltage-intensive events, it switches on non-destructively in order to avoid damage to itself and the connected system. This enables drastically simplified protection against lightning strikes, for example.

The integrated protection functions (triggering structures of the first and second types) can consist of two different sub-functions, which together guarantee the protection of the power semiconductor component against overload caused by overvoltage. These functions trigger the switching of the power semiconductor component internally when a specific anode-cathode voltage is exceeded and/or when a specific voltage gradient dv/dt is exceeded. The targeted design of the integrated protection functions can safely prevent damage to the semiconductor component, as explained in detail here.

In addition, the overvoltage protection function can also be effected in a trigger region by an externally supplied light pulse (e.g. laser signal) and/or an external electrical activation signal. The trigger region with the integrated protection functions is located (essentially exactly) in the center, so that the component is switched on non-destructively when very fast, high-voltage-intensive events occur.

The inventive power semiconductor component, e.g. designed and configured as an optically or electrically triggered unidirectional or bidirectional semiconductor with integrated protection functions, can be deployed directly in medium/high-voltage systems (e.g. on the high-voltage winding of medium-voltage transformers) without an external RC protection circuit, or similar systems.

In the bi-directional design, two triggering structures each with BOD and dv/dt protection functions are preferably arranged facing each other on a chip (i.e. in a semiconductor body). Here it is essential that the BOD- and/or dv/dt-sensitive structures are located on both sides, i.e. the front and rear of the semiconductor body. However, the two structures facing each other in the vertical direction must not adversely affect each other in operation. The structures are then not arranged exactly spatially opposite each other, but are arranged laterally offset (in a radial direction) at a sufficient distance from each other. A central location is not advantageous in this case.

Both triggering structures then extend facing away from each other into the respective other half of the semiconductor body, thus lying diametrically opposite each other.

In order that the two antiparallel-connected structures do not interfere with each other in their function, they are preferably separated from each other by means of a separation (e.g. separation trench) which passes through the center of the chip. This means that the cathode metallization (cathode electrode) of the first structure is galvanically isolated from the anode metallization (anode electrode) of the second structure. For example, an aluminum metallization in this separation trench may not be continuously formed (cathode and anode on the one, same side are galvanically isolated). On the other hand, it may be advantageous not to arrange the base zones (e.g. p-base) of the two antiparallel structures in this separation region to be electrically continuous. For example, the separation region can be formed as a strip-like resistance zone, for example, as a weakly-doped p zone (weak Al population), but in which strongly doped p-zone regions are located.

In addition, this separation region or separation trench, which can have a width of approximately 200 µm to approximately 500 µm, can be supplemented by an additional local (charge carrier) lifetime setting.

A lateral or radial direction of extension in the semiconductor body is understood here as a direction essentially perpendicular to the vertical direction of extension of the semiconductor body. In the case of a semiconductor body formed as a cylinder, for example, (with low height), the vertical extension direction corresponds to the direction of the cylinder height and the lateral direction to the radial direction of the cylinder. The terms lateral and radial are used here interchangeably.

It should also be noted that the front-side center and the rear-side center of the short-circuit semiconductor component may differ, but this is not mandatory and in fact usually not the case. The two centers usually define a symmetry axis of the semiconductor body from which the radius of the semiconductor body is determined. When in the following a center is referred to with respect to a front-side component of the short-circuit semiconductor component, this center should always be understood to be the front-side center, unless expressly specified otherwise. Likewise, in the case of a relationship between a center and a rear-side component of the semiconductor body, the rear-side center is to be understood accordingly, unless expressly defined otherwise.

It should be understood that an emitter structure electrically conductively contacted with the front-side electrode is a front-side activation structure in which the emitter structure of the second conductor type is embedded in the front-side base zone of the first conductor type adjacent to the front of the semiconductor body in such a way that it is electrically conductively contacted at least in some regions by the application of the front-side electrode to the front side of the semiconductor body. The same behavior is found, mutatis mutandis, in an emitter structure electrically conductively contacted with the rear-side electrode, which is therefore a rear-side activation structure, in which the emitter structure of the second conductor type is embedded in the rear-side base zone of the first conductor type adjacent to the rear of the semiconductor body in such a way that it is electrically conductively contacted at least in some regions by the application of the rear-side electrode to the rear side of the semiconductor body. The emitter structure is preferably contacted with the respective front-side or rear-side electrode by direct contact between the respective components.

According to a further aspect of the invention, a method for voltage limiting by means of a power semiconductor component, in particular one according to any of the embodiments disclosed herein, comprises the following steps, wherein the power semiconductor component comprises a semiconductor body in which, in a vertical direction from a rear side to a front side opposite the rear side, a rear-side base zone of a first conductor type, an inner zone of a second conductor type complementary to the first conductor type, and a front-side base zone of the first conductor type are arranged consecutively, wherein the rear-side base zone is electrically contacted by a rear-side electrode and the front-side base zone is electrically contacted by a front-side electrode, wherein in at least one of the two base zones at least one activation structure formed as an emitter structure of the second conductor type is embedded, which is electrically contacted by the electrode contacting the embedding base zone, wherein the activation structure can be switched on by means of at least one triggering structure which electrically acts on it via the semiconductor body and which can be activated by means of at least one electrical activation signal supplied to it, at least one triggering structure being provided as a breakdown structure of a first type, which is designed to be activated when a high voltage above a predetermined voltage level(=breakdown voltage), forming its activation signal, is applied between the front-side electrode and the rear-side electrode and at least one additional triggering structure is provided as a breakdown structure of a second type, which is designed to be activated when a high voltage above a predetermined voltage gradient (dv/dt), forming its activation signal, is applied between the front-side and the rear-side electrode:

applying an electrical voltage to the front-side electrode and rear-side electrode, activating the breakdown structure of the second type due to a voltage change of the voltage applied to the electrodes that is greater than the predetermined voltage gradient and/or activating the breakdown structure of the first type due to a high voltage greater than the predetermined voltage level(=breakdown voltage) between the front-side electrode and the rear-side electrode, clamping the voltage applied between the front-side electrode and the rear-side electrode to the predetermined voltage level(=breakdown voltage) of the breakdown structure of the first type during an activation period (in particular an activation delay) of the triggering structures, complete activation of the activation structure after the activation period has elapsed and reducing the voltage applied to the electrodes, in particular to a value less than 10 V.

The definitions of terms used herein are summarized below:

I. Activation structure:
  Structure for switching on the power semiconductor component and establishing a low-resistance electrically conductive connection between the main terminals, i.e. between the cathode and anode electrodes.
  Embodiment as an emitter structure.

II. Activation signal:
  Signal for initiating the activation of an activation structure.
  Possible embodiment as:
    separate electrical signal supplied externally to the power semiconductor component according to the invention;
    separate optical signal, supplied externally to the power semiconductor component according to the invention;
    electrical voltage/operating voltage applied to the electrical main terminals (cathode/anode) of the power semiconductor component according to the invention.

III. Inrush current:
  a current obtained from the activation signal, supplied to an activation structure formed as an emitter structure, in order to trigger it or switch it on.

IV. Triggering structure:
  Structure for forwarding the supplied activation signal to an activation structure. Possible embodiment as:
    Gate electrode; supplied activation signal: II.a;
    Light-sensitive semiconductor region (optical gate); supplied activation signal: II.b;
    Breakdown structure (e.g. in the form of a BOD, dv/dt structure); supplied activation signal: II.c.

V. Amplifying-gate structure (AG structure):
  an auxiliary structure arranged between a triggering structure and an activation structure for amplifying the activation signal coupled into the power semiconductor component according to the invention via the triggering structure.

BRIEF DESCRIPTION OF THE FIGURES

Further features and advantages of the invention are obtained from the following description of exemplary embodiments of the invention, which is not to be interpreted restrictively, and which is explained in more detail below with reference to the drawing. In the drawing, schematically in each case.

DETAILED DESCRIPTION

In the different figures parts that are equivalent in terms of their function are always labeled with the same reference numeral, so that these are generally described only once.

Figure 1:
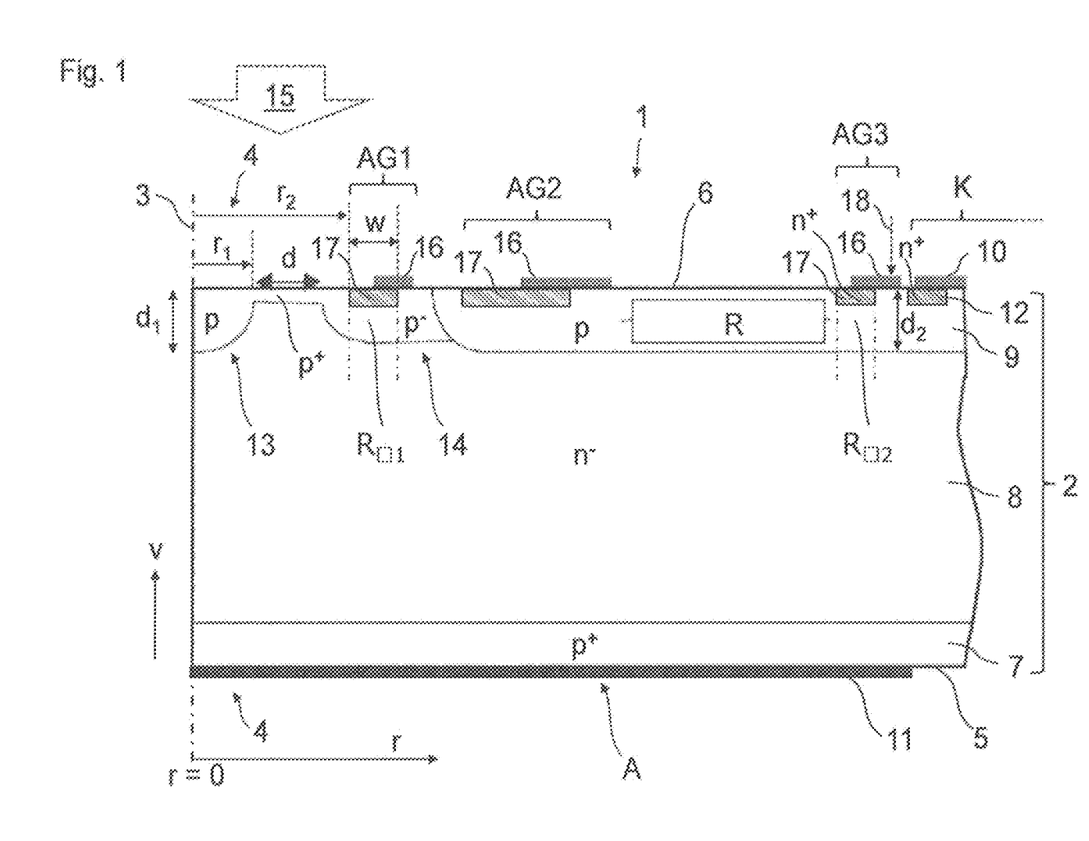
FIG. 1 shows a vertical section through an exemplary embodiment of a power semiconductor component according to the invention.

FIG. 1 shows a simplified cross-section of an exemplary embodiment of a power semiconductor component 1 according to the invention. The power semiconductor component 1 for voltage limiting comprises a semiconductor body 2 in which, in a vertical direction v from a rear side 5 towards a front side 6 facing the rear side 5, a rear-side base zone 7 of a first conductor type p, an inner zone 8 of a second conductor type n complementary to the first conductor type p, and a front-side base zone 9 of the first conductor type p are arranged consecutively. The rear-side base zone 7 is electrically contacted to a rear-side electrode 11 (also referred to as the anode). The front-side base zone 9 is electrically contacted to a front-side electrode 10 (also referred to as the cathode). In at least one of the two base zones 7, 9 at least one activation structure 12 is embedded, which is formed as an emitter structure of the second conductor type n, which is electrically contacted by the electrode 10, 11 that contacts the embedding base zone 7, 9. The activation structure 12 can be switched on by means of at least one triggering structure 13, 14, 16 and/or AG, which electrically acts on the activation structure via the semiconductor body 2, which in turn can be activated by means of at least one electrical activation signal fed to it. In this example, the triggering structure 13 is designed as a breakdown structure of a first type, in particular as a break-over diode structure (BOD). This is designed to be activated when a high voltage above a predetermined voltage level (=breakdown voltage), forming its activation signal, is applied between the front-side electrode 10 and the rear-side electrode 11. In addition, a further triggering structure 14 is provided in the power semiconductor component 1 as a breakdown structure of a second type. This is designed to be activated when a high voltage above a predetermined voltage gradient dv/dt, forming its activation signal, is applied between the front-side electrode 10 and the rear-side electrode 11.

As can be seen in FIG. 1, the triggering structure 13 of the first type is arranged in the central area 4 of the semiconductor body 2. The triggering structure 14 of the second type is arranged further outward in the radial direction r of the semiconductor body 2 in relation to the triggering structure 13 of the first type in the present semiconductor component 1 shown.

In this example of the power semiconductor component 1, the two protection functions are thus provided in the form of two triggering structures 13 and 14. The size of the breakdown voltage of the breakdown structure 13 is essentially determined by the radius $r_1$ of the central surface (central areas 4) of the triggering structure 13 and the distance d. This protective voltage can be set to 80% to 70% of the maximum breakdown voltage of the power semiconductor component 1 (see also FIG. 2).

Furthermore, in the component 1 shown in FIG. 1, a triggering stage structure AG which in this case has three triggering stages AG1, AG2, AG3 is provided in the radial direction r of the semiconductor body 2 between the triggering structure 13 or 14 and the activation structure 12. These are arranged in such a way that the triggering structure 13 and/or 14, when activated, switches on the activation structure 12 by triggering at least one of the triggering stages AG1, AG2, AG3.

In the exemplary power semiconductor component 1, the triggering structure 14 of the second type is arranged in the semiconductor body 2 in such a way that, when activated, it triggers at least one of the triggering stages AG1, AG2, AG3, here stage AG1, of the triggering stage structure AG.

For example, the triggering stage AG1 or a radially further inward semiconductor region can be formed as a light-sensitive semiconductor region, to which (additionally) an optical signal 15 (e.g. laser light) can be supplied as the activating switch-on signal, as indicated in FIG. 1. It should be pointed out that the power semiconductor component according to the invention does not require a light-controllable triggering structure, but this can be optionally present provided that an external, optical control/activation of the semiconductor component 1 is additionally desired depending on the specific application.

The region that can be illuminated by the optical signal 15 (e.g. laser light), can extend over the entire range with the radius $r_2$ or up to the beginning of the inner edge of the metallization 16 of the 1st triggering stage AG1. Within this semiconductor region (approximately a circle with radius $r_2$), the optical signal can strike the non-metalized semiconductor surface and penetrate the semiconductor body 2. The light quanta are energetically absorbed by the semiconductor, which generates electron-hole pairs in response. Given appropriate polarity of the external voltage (negative pole on terminal K, positive pole on terminal A), the holes drift through the p-base 9 to the cathode 10, thereby acting as the activation signal or activation/triggering current for the AG structure, in particular for the 1st triggering stage AG1.

The example of FIG. 1 also shows that a lateral current limiting resistor R is arranged between the second triggering stage AG2 and the third triggering stage AG3.

Furthermore, without necessarily being limited to this, one of the triggering stages AG1, AG2, AG3, indicated in the present case on the triggering stage AG3, can be provided as an additional triggering structure formed as electrode 16, to which an external electrical signal 18 can be supplied as the activating switch-on signal. Again, it should be pointed out that the power semiconductor component according to the invention does not require a triggering structure that can be activated via an external electrical signal 18, but this can be optionally present provided that an external, electrical control/activation of the semiconductor component 1 is additionally desired depending on the specific application.

If a triggering structure 16 is provided in the form of an electrode, this is generally provided by the triggering stage of the triggering stage structure AG that is arranged after the current limiting resistor R and before the activation structure 12 in increasing radial direction r of the semiconductor body 2, in this case therefore by the third triggering stage AG3.

If the breakdown voltage of the breakdown structure 13 is reached, this leads to a sharp increase in the leakage current. In this case this current triggers the first triggering stage AG1, which in turn switches on the main central structure 12 and thus the entire component 1. The inrush current of the triggering stage structure AG is primarily dependent on the lateral width of this ring-shaped region.

A very strong voltage rise (dv/dt event) leads to a capacitive displacement current in the entire p-type base zone, which is directly proportional to the slope of the voltage rise dv/dt and inverts the charge of the junction capacitance. If dv/dt is greater than the critical dv/dt of the breakdown structure 14, this current triggers the 1st AG stage AG1, which in turn switches on the semiconductor component 1 again. In a similar manner to the overvoltage protection structure 13, the triggering current can be determined from the width w of the 1st triggering stage AG1. Here, the diameter of the structures is of crucial importance: a higher dv/dt resistance requires a smaller diameter, as a large diameter would lead to larger capacitive displacement currents. This limits the maximum dv/dt and leads to typical structures with a diameter of less than 1 mm.

In order to protect these small structures from high inrush currents, a zone with the increased resistance R can be integrated in the base zone 9 to limit the current (FIG. 1). The resistance R is between approximately 5 ohms and 50 ohms, depending on the application.

The power semiconductor component 1 shown in FIG. 1 as an example can be triggered essentially in three different ways:
1. With an external light pulse, e.g. laser pulse;
2. By an external electrical current signal;
3. Without an external signal.

In case 1, an optical signal 15 can be injected directly into the 1st triggering stage AG1, which switches on the power semiconductor component 1.

In case 2, an external electrical signal 18 can be applied to the 3rd triggering stage AG3.

In both cases, the component 1 is triggered externally, but also maintains the internal protective capacity of the overvoltage protection of the triggering structure 13 and the dv/dt protection of the triggering structure 14.

In case 3, the power semiconductor component 1 is not triggered externally, but only in the event of a critical state. External control units are not required, which gives rise to simplified systems while maintaining the full overvoltage and dv/dt protection. This design variant is particularly preferred, as in principle no external activation or protective circuitry is required for the power semiconductor component 1 to provide the protection function described here.

In the following, for the power semiconductor component 1 from FIG. 1, which is designed without restriction by way of example for a breakdown voltage of the breakdown structure 13 of the first type (BOD) of 8 kV, geometric and electrical properties are specified which guarantee the effect according to the invention. It should be understood that other values can be used depending on the specific design of the semiconductor component 1. The invention is not necessarily limited to the numerical values listed below.

Breakdown Voltage Level:

The typical orders of magnitude mentioned here, which determine the size of the breakdown voltage of the breakdown structure 13 of the first type (e.g. BOD), generally apply to a power semiconductor component with a blocking voltage of 8 kV. For this voltage class, the specific resistance or rho value of the weakly-doped central zone of the semiconductor is typically in the range of 480 Ω·cm, in particular between approximately 450 and 510 Ω·cm. This results in a range for the breakdown threshold of 7.5 to 9.5 kV. The figures refer to the temperature at the usage site, e.g. $-40°\ C. \leq TVj \leq 120°\ C.$ Essentially, the size of the breakdown voltage depends on the radius of curvature $r_1$ of the central breakdown region of the front-side p-base zone, which can preferably be approximately 40 to 60 μm, and the distance d which can be in the range of approximately 300 to 450 μm. The radius of curvature $r_1$ also depends on the penetration depth $d_1$ of the p-zone at the center 4, which can preferably be in the range of approximately 50 to 70 μm. For other blocking voltage classes or rho values, the lateral/radial dimensions in particular can be adjusted accordingly.

Dv/Dt Threshold:

The desired dv/dt threshold of the breakdown structure 14 of the second type is independent of the rho value, in contrast to the size of the breakdown voltage of the breakdown structure 13 of the first type. It is determined by the internal diameter $r_2$ of the auxiliary cathode of the 1st AG and can preferably be approximately 400 to 500 μm, by the width w of this auxiliary cathode (preferably approximately 75 to 125 μm), and by the specific resistivity $R_{\square 1}$ in the p zone 14 below the ring-shaped auxiliary cathode region of the first triggering stage AG1, which can preferably be between approximately 3000 to 5000Ω. Compared to the main cathode 12 or the auxiliary cathodes of the other triggering stages AG2, AG3, this value is increased by a factor of 10 to 20. In other words, the specific resistivity $R_{\square 2}$ indicated in FIG. 1 is therefore approximately 300Ω.

In order to set the desired dv/dt value, the specific resistivity $R_{\square 1}$ must be adjusted and monitored accordingly using processing technology. In this way, the triggering/activation voltage gradient of e.g. 3 kV/μs can be set, preferably in a range of approximately 2.5 to 6 kV/μs, for the temperature range Tvj given above. If the above-described fault event (avalanche voltage pulse) occurs in the application, the semiconductor component 1 is switched on or switched to conducting, and the applied anode-cathode voltage is limited or reduced to very low values (<10 V).

Figure 2:
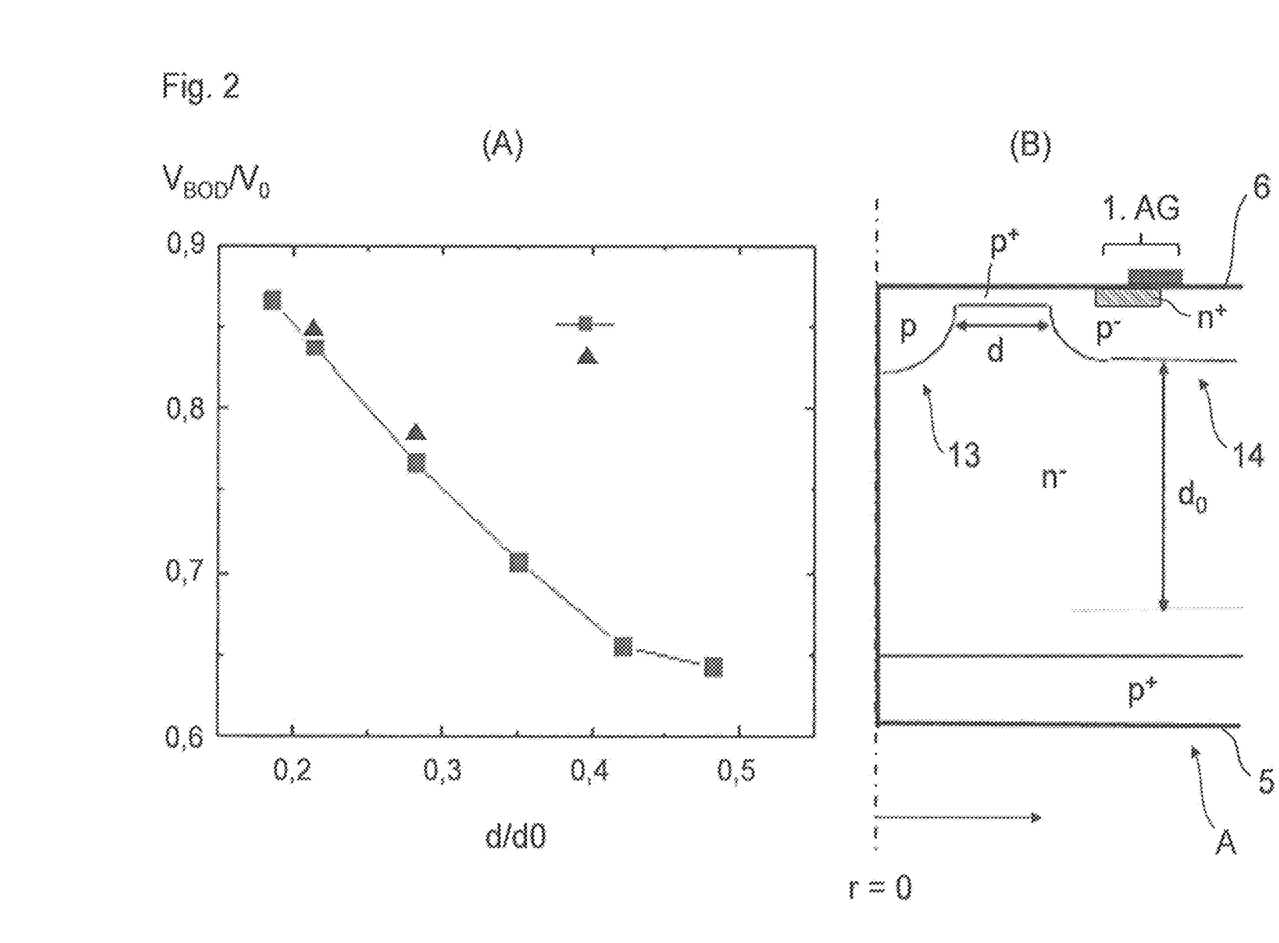
FIG. 2 shows, in view A, a graph explaining the targeted setting of a breakdown voltage of a triggering structure designed as a first-type breakdown structure (BOD structure) of the power semiconductor component from FIG. 1, partially shown in view B.

FIG. 2 shows, in view A, a graph explaining the targeted adjustment of a breakdown voltage of the triggering structure 13 of the first type, designed as a breakdown structure (here a BOD structure), of the power semiconductor component 1 from FIG. 1, partially shown in view B. In view A of FIG. 2, the data points marked with a square represent the result of a component simulation, and the data points marked with a triangle represent the result of a measurement that was performed. The graph shows the dependence of the adjustable overvoltage/breakdown voltage $V_{BOD}$ of the breakdown structure 13 on the curvature of the central pn junction and the distance d between the central p-region 13 and the p-base of the breakdown structure 14 of the 1st triggering stage AG1.

Figure 3:
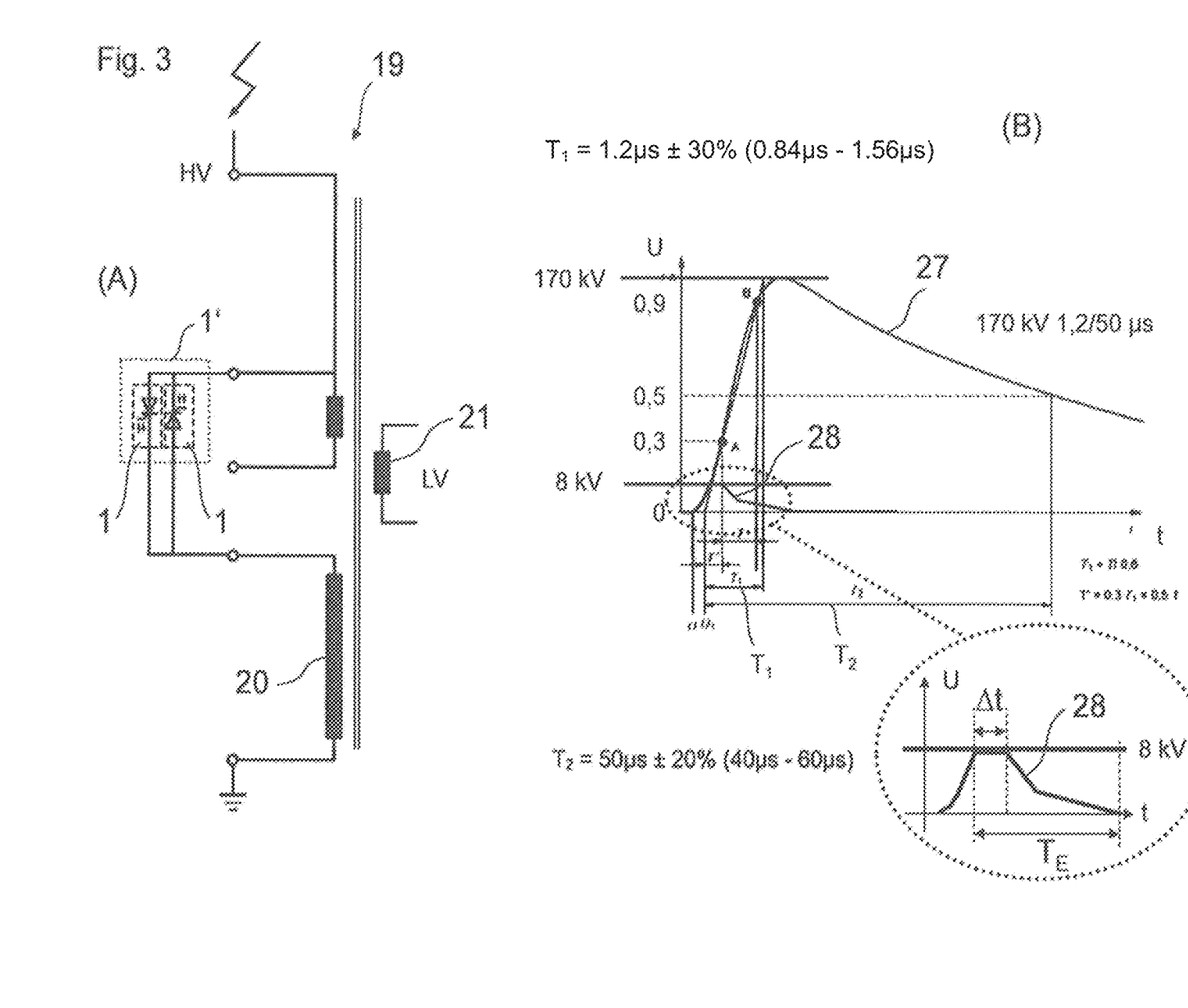
FIG. 3 shows, in view A, an example arrangement of a power transformer and two power semiconductor components from FIG. 1 and, in view B, a voltage-time diagram of a standardized test pulse voltage.

FIG. 3 shows in view A an example arrangement of a power transformer 19 and two power semiconductor components 1 from FIG. 1, and in view B a voltage-time diagram of a standardized test pulse voltage 27 of 170 kV and 1.2/50 μs, which is supplied on the high-voltage HV side of the transformer 19 for testing purposes. The power transformer 19 is preferably a high-voltage transformer, but is not necessarily limited to this. The power transformer 19 can therefore be designed for high electrical voltage, i.e. for voltages generally greater than 1 kV, as well as for an electrical power in the range of, for example, approximately 1 MVA to approximately 100 MVA.

FIG. 3 also shows that the two power semiconductor components 1 are electrically interconnected in antiparallel and connected to two different winding taps of a high-voltage winding 20 of the transformer 19. It should be understood that the two power semiconductor components 1 can be designed as separate components.

The two power semiconductor components 1, which are interconnected in antiparallel, can alternatively be provided in a single power semiconductor component 1'. In this case, both individual power semiconductor bodies 1 (e.g. as in FIG. 1) preferably share a common semiconductor body 2 (not shown), wherein they are arranged in this diametrically opposite each other.

In this case, the individual power semiconductor components 1 can be electrically isolated from each other by a separation trench (not shown). For example, the separation trench can be constructed as a galvanic isolation or resistance zone between the two individual power semiconductor components 1 arranged in a common semiconductor body 2.

View B of FIG. 3 also shows, in addition to the temporal waveform of the test pulse voltage 27, a component voltage 28 (voltage between the electrodes 10 and 11) of the power semiconductor component 1 according to the invention. For clarity, the component voltage 28 is also reproduced in an enlarged view in FIG. 3, view B.

It can be seen that the component voltage 28 initially increases equally steeply with the steep voltage rise in the test voltage 27. As a result, the breakdown structure 14 of the second type is activated due to the very high voltage gradient dv/dt. The predetermined breakdown voltage, for example 8 kV for the present semiconductor component 1, of the breakdown structure 13 of the first type has not yet been reached at the start of the voltage rise of the test voltage 27 and the breakdown structure 13 is initially inactive. This is not activated until the breakdown voltage, in the present case 8 kV, has been reached, as can be seen in the enlarged view of FIG. 3, view B.

As already described above, as a result of the combination of the two breakdown structures 13 and 14 the avalanche behavior clamps the component voltage 28 in the power semiconductor component 1 according to the invention to the predetermined breakdown voltage of the breakdown structure 13, in this case 8 kV, for example for the duration of the activation delay Δt of the triggering structures, i.e. in the example shown, the breakdown structures 13 and 14, as well as the triggering stage structure AG, which can usually be between about 0.5 μs and 5 μs. Only after the activation delay Δt has elapsed, i.e. when the activation structure 12 also starts to switch on, does the component voltage 28 drop significantly. Overall, after the entire activation time $T_E$ has elapsed the power semiconductor component 1 is fully conducting.

In detail: when the BOD structure 13 arranged in the central area 4 or the pn junction formed by it in the region with radius $r_1$ reaches its breakdown voltage, the blocking current increases locally and acts as the activation/triggering current for the following AG structure, in particular for the first triggering stage AG1. As soon as the voltage 28 on the electrodes 10 and 11 reaches a critical threshold, the breakdown current of the BOD structure 13 (locally very limited in the region of the central BOD) increases sharply, almost in real time to the level of the voltage applied to the main electrodes 10 and 11, and triggers AG1 as soon as it reaches the triggering threshold of AG1.

However, until the entire power semiconductor component 1 switches on, i.e. in chronological order first the breakdown structures 13, 14, then the AG structure with its triggering stages AG1, AG2, AG3, and finally the subsequent activation/emitter structure 12, which in terms of space makes up the largest proportion of the area of the semiconductor component 1, the activation time/switch-on delay time Δt shown in FIG. 3, which can be up to approximately 5 μs, elapses. It should be understood that the activation structure 12 is only starting to conduct by this point and is not yet fully conducting. In this phase, the component 1 essentially behaves as a high-valued resistor.

With increasing propagation of the current plasma in the region of the activation structure 12, the resistance value of the conducting zones, consisting of the auxiliary emitters 17 of the individual AG stages AG1, AG2, AG3 and the partially flooded area of the main emitter 12, decreases. In the time range greater than 5 μs up to several 100 μs or up to approximately 1 ms, the current plasma propagates further and further along the activation structure or main emitter 12 in the radial direction r from inside to outside. The resistance value and the forward voltage, i.e. the external voltage applied between electrodes 10 and 11, decrease continuously at the same time. After a few 10s of microseconds, the internal AG stages turn off as the current now only flows through the activation structure 12, which until then had become very low-resistance.

The activation delay Δt is composed of the delayed effect of the breakdown structure 13 (minor component) and substantially the activation of the entire semiconductor structure triggered by the breakdown current, i.e. starting with the activation of the 1st triggering stage AG1, and then by the consecutive activation of the remaining triggering stages AG2 and AG3 until the start of the linear current supply of the activation/emitter structure 12. However, the latter is not yet fully conductive over its entire surface.

During this activation delay time Δt, the clamping of the component voltage 28 shown in view B of FIG. 3 takes place. It begins with the rise of the breakdown current of the BOD structure 13 and ends approximately with the beginning of the linear conductivity along a finger structure of the main emitter 12 that is usually provided.

The waveform of the component voltage 28 that rapidly drops after Δt is to be attributed to the progressive lateral/radial propagation of the current plasma in the activation structure 12 and extends over several 100 μs to approximately 1 ms or even longer, which ultimately depends on the size of the activation structure 12 or the diameter of the semiconductor component 1 (propagation velocity in the cathode: approx. 0.1 mm/μs). This period is much longer than Δt, that is $T_E \gg \Delta t$. The power semiconductor component 1 is only switched fully to the conducting state after the entire activation period $T_E$ has elapsed.

Figure 4:
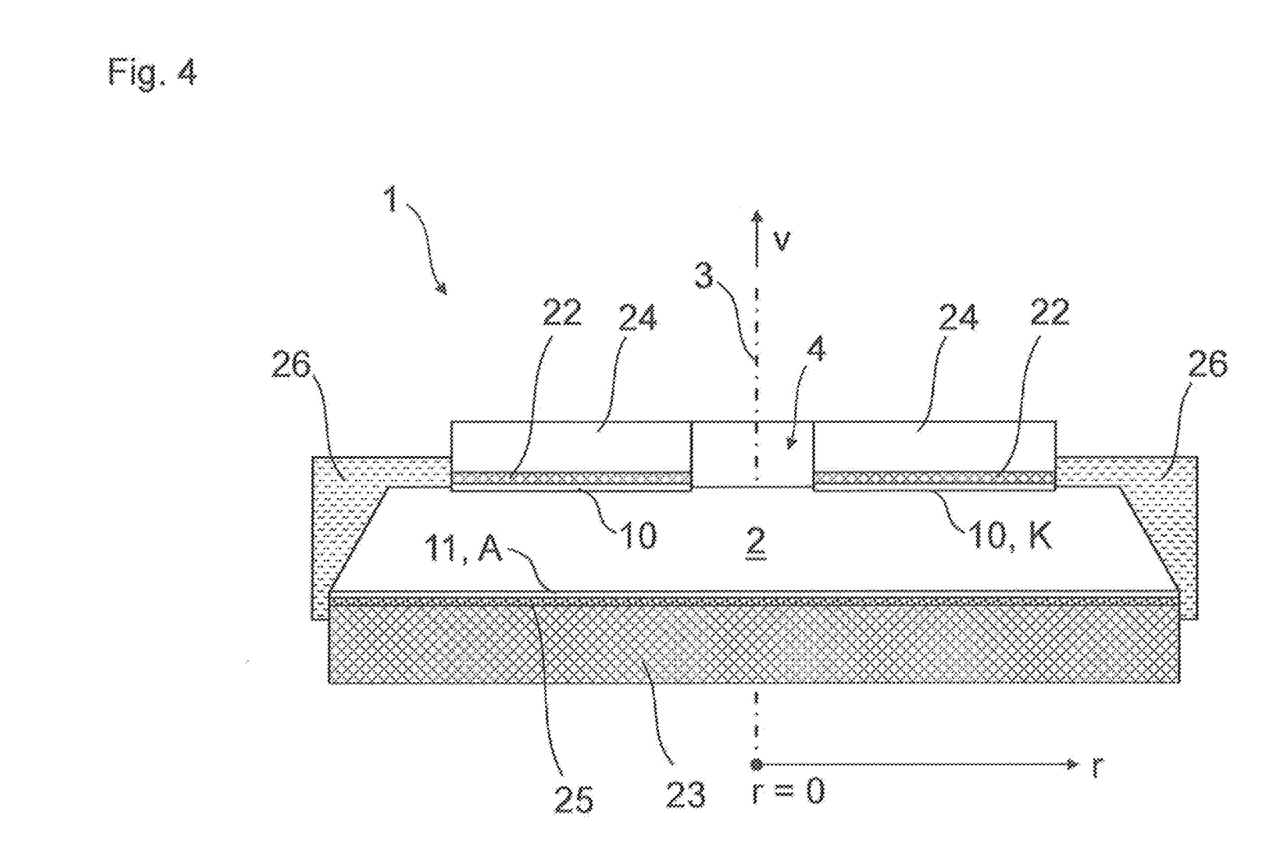
FIG. 4 shows a vertical section through a further exemplary embodiment of the power semiconductor component of FIG. 1.

FIG. 4 shows a highly simplified vertical section through a further exemplary embodiment of the power semiconductor component 1 of FIG. 1. In the example shown, the front-side electrode 10 (cathode) and the rear-side electrode 11 (anode) are each pressure-contacted in an electrically conductive manner by means of an electrically conductive (e.g. metallic) contact disc 22 or 23. It should be understood that the radial interior of the power semiconductor component 1, in which the structures 13, 14, AG1, AG2, AG3 represented in FIG. 1 are arranged, is not contacted by the front-side contact disc 22.

In this case, the contact discs 22 and 23 are each molybdenum contact discs, without being necessarily limited to this. Furthermore, in this example, the front-side or cathode-side contact disc 22 is combined with a copper stamp 24, whereas the underside/anode-side contact disc 23 is designed as a pure molybdenum contact or carrier disc.

It is clear from FIG. 4 that the underside contact disc 23 has a much greater thickness than the upper contact disc 22. In this way, the anode-side contact disc 23 acts as a heat sink to dissipate heat generated in the semiconductor body 2 from the semiconductor body 2. This is generated in particular during the activation time $T_E$ shown in view B of FIG. 3 after the activation delay $\Delta t$ has elapsed. In particular in cases where after the component voltage has been clamped (in this case, for example to 8 kV) significantly more time elapses during the relatively short period of time $\Delta t$ until the component 1 completely becomes conducting, for example 50 µs or several 100 µs to approximately 1 ms and beyond, a high thermal load is generated in the semiconductor component 1 after the breakdown structures 13, 14 and the AG stages are switched on/activated. In this case, the contact/carrier disc 23, which acts as a heat sink, is particularly effective because it dissipates the heat generated in the semiconductor body 2 from the component 1 reliably and quickly and safely protects it from thermal damage.

For example, the thickness of the contact discs 22 and 23 can be between 1 and 5 mm.

In addition, in the example shown in FIG. 4, between the contact disc 23 which acts as a heat sink and the anode-side electrode 11, a low-temperature connection layer (LTC) 25 is arranged, which is formed in this case as a sintered layer and provides a permanent connection between the contact disc 23 and the electrode 11 with low thermal transfer resistance. However, the LTC connection is not mandatory for the embodiment of the invention.

Furthermore, the power semiconductor component 1 in FIG. 1 has a passivation layer 26 (silicone) on its outer edges.

As can be clearly seen in FIG. 4, the entire rear-side anode electrode 11 of the semiconductor component 1 is contacted by the contact disc 23. Furthermore, the maximum possible cathode-side component surface area, i.e. the front-side cathode electrode 10, is also pressure-contacted by the contact disc 22 and the copper stamp 24.

In particular, the features and feature combinations cited in the general description and the description of the figures and/or in the figures alone are applicable not only in the respective combinations indicated herein but also in other combinations or in isolation.

For example, an inverse npn layer sequence to the pnp structure of the semiconductor body shown in the exemplary embodiments is possible. In this case, the weakly n-doped semiconductor inner zone consists of a weakly p-doped inner zone and the front-side and rear-side base zones each consist of an n-doped layer, etc. The conductor types of the activation structures described here would also be correspondingly inverted in such a case.

In a particularly preferred design, the power semiconductor component according to the invention is used as touch protection or personal protection, as well as for plant/system protection in medium/high-voltage systems.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor component for voltage limiting, comprising:
   a semiconductor body in which, in a vertical direction proceeding from a rear side toward a front side opposite the rear side, a rear-side base zone of a first conduction type, an inner zone of a second conduction type complementary to the first conduction type, and a front-side base zone of the first conduction type are arranged successively,
   wherein the rear-side base zone is electrically contacted with a rear-side electrode and the front-side base zone is electrically contacted with a front-side electrode,
   wherein at least one switch-on structure embodied as an emitter structure of the second conduction type is embedded at least into one of the rear-side base zone and the front-side base zone and is electrically contacted by the electrode contacting the at least one of the rear-side base zone and the front-side base zone into which the at least one switch-on structure is embedded,
   wherein the switch-on structure is configured to be switched on by at least one triggering structure which acts on the switch-on structure electrically via the semiconductor body and which is activatable by at least one electrical switch-on signal fed to the switch-on structure,
   wherein at least one triggering structure is provided as a breakdown structure of a first type, which is designed to be activated when there is a high voltage, forming a switch-on signal of the at least one triggering structure and present between the front-side electrode and the rear-side electrode, starting from a predetermined voltage level,
   wherein at least one further triggering structure is provided as a breakdown structure of a second type, which is designed to be activated when there is a high voltage, forming a switch-on signal of the at least one further triggering structure and present between the front-side electrode and the rear-side electrode, starting from a predetermined voltage gradient,
   wherein the front-side electrode and the rear-side electrode are each electrically conductively pressure-contacted by an electrically conductive contact plate, such that there is in each case a contact-bonded connection or a fixed connection between the front-side electrode and the rear-side electrode and the corresponding electrically conductive contact plate, and at least one of the contact plates is embodied in such a way to function as a heat sink for dissipating heat generated in the semiconductor body out of the semiconductor body.

2. The power semiconductor component of claim 1, wherein a level of the at least one triggering structure is in a range of 60% to 90% of a maximum breakdown voltage of the semiconductor body.

3. The power semiconductor component of claim 1, wherein the at least one triggering structure is a break-over semiconductor structure.

4. The power semiconductor component of claim 1, wherein the at least one triggering structure is arranged in a central region of the semiconductor body and the at least one further triggering structure is arranged further outward in a radial direction of the semiconductor body with respect to the at least one triggering structure.

5. The power semiconductor component of claim 1, wherein a triggering stage structure with at least one triggering stage is provided and arranged in a radial direction of the semiconductor body between the at least one triggering structure and the switch-on structure such that the at least one triggering structure, when activated, the at least one triggering structure switches on the switch-on structure by way of triggering of the at least one triggering stage.

6. The power semiconductor component of claim 5, wherein the at least one further triggering structure is arranged in the semiconductor body such that, when activated, the at least one further triggering structure triggers the at least one triggering stage of the triggering stage structure.

7. The power semiconductor component of claim 5, wherein at least one still further triggering structure of the at least one triggering structure is a light-sensitive semiconductor region to which an optical signal can be fed as an activating switch-on signal.

8. The power semiconductor component of claim 5, wherein at least two triggering stages are provided, a lateral current limiting resistor being arranged between one triggering stage and another triggering stage of the at least two triggering stages.

9. The power semiconductor component of claim 5, wherein at least one still further triggering structure of the at least one triggering structure is an electrode to which an electrical signal can be fed as an activating switch-on signal, the triggering structure embodied as an electrode being a triggering stage electrode of the at least one triggering stage.

10. The power semiconductor component of claim 9, wherein the triggering structure embodied as an electrode is the triggering stage electrode of that triggering stage of the at least one triggering stage which is arranged downstream of a current limiting resistor and upstream of the switch-on structure in the radial direction of the semiconductor body.

11. The power semiconductor component of claim 1, wherein a low-temperature connection layer is arranged between the contact plate that electrically conductively pressure-contacts the rear-side electrode and the rear-side electrode.

12. The power semiconductor component of claim 1, further comprising a housing accommodating the semiconductor body and having a lead-through only for the high voltage present in each case at the front-side electrode and the rear-side electrode.

13. An arrangement comprising a first power semiconductor component for voltage limiting as claimed in claim 1 and a second power semiconductor component for voltage limiting as claimed in claim 1, wherein the first and second power semiconductor components are electrically interconnected in antiparallel.

14. The arrangement of claim 13, wherein the first and second power semiconductor components are arranged diametrically with respect to one another in a common semiconductor body and are electrically isolated from one another by a separation trench.

15. The arrangement of claim 14, wherein the separation trench is a galvanic isolation or a resistance zone between the first and second power semiconductor components.

16. An arrangement comprising a power transformer and at least one power semiconductor component for voltage limiting as claimed in claim 1, wherein the at least one power semiconductor component is connected to a high-voltage winding of the power transformer.

17. The arrangement of claim 16, wherein the power transformer is a high-voltage transformer.

18. A method for voltage limiting by the power semiconductor component of claim 1, the method comprising:
    applying an electrical voltage to the front-side electrode and the rear-side electrode;
    activating the breakdown structure of the second type owing to a voltage change of the voltage present at the front-side electrode and rear-side electrode that is greater than the predetermined voltage gradient and/or activating the breakdown structure of the first type owing to a high voltage present between the front-side electrode and the rear-side electrode that is greater than the predetermined voltage level;
    clamping the voltage present between the front-side electrode and the rear-side electrode to the predetermined voltage level of the breakdown structure of the first type during an activation period of the triggering structures; and
    fully switching on the switch-on structure after the activation period has elapsed and reducing the voltage present between the front-side electrode and the rear-side electrode.

* * * * *